(12) United States Patent
Kenny

(10) Patent No.: US 6,281,708 B1
(45) Date of Patent: Aug. 28, 2001

(54) TRI-STATE BUS AMPLIFIER-ACCELERATOR

(75) Inventor: John D. Kenny, Fremont, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/333,834

(22) Filed: Jun. 15, 1999

(51) Int. Cl.$^7$ .................. H03K 19/094; H03K 19/0175
(52) U.S. Cl. .................. 326/86; 326/87; 326/24
(58) Field of Search .................. 326/86, 87, 24; 327/51

(56) References Cited

U.S. PATENT DOCUMENTS

| | | | |
|---|---|---|---|
| 4,482,824 | * 11/1984 | Tzeng | 307/530 |
| 5,272,368 | * 12/1993 | Turner et al. | 365/189.05 |
| 5,936,895 | * 8/1999 | Shirley | 365/189.07 |

\* cited by examiner

*Primary Examiner*—Huan Hoang
(74) *Attorney, Agent, or Firm*—Skjerven Morrill MacPherson LLP; Edward C. Kwok

(57) ABSTRACT

The present invention provides a centralized amplifier-accelerator a tri-state bus. The centralized amplifier-accelerator utilizes the module drivers as pre-drivers to the amplifier-accelerator. The centralized amplifier-accelerator is located physically in the center of the chip. This central amplifier-accelerator consists of a highly sensitive input sense circuit which detects voltage transition at very near the N-channel threshold for rising transitions and at very near the P-channel threshold for falling transitions. Once the sense circuit threshold is met, the output driver is triggered to drive the bus.

28 Claims, 3 Drawing Sheets

TRI-STATE BUS AMPLIFIER-ACCELERATOR

BACKGROUND OF THE INVENTION

1. Field of the Invention

The present invention relates to a tri-state bus structure. In particular, the present invention relates to a tri-state bus amplifier-accelerator for driving long and heavily loaded busses.

2. Discussion of the Related Art

Bus structures for carrying data or control signals are generally long and connected to and through a significant number of circuits and subsystems. Thus, capacitance associated with such bus structures are appreciable. Careful design of such bus structures is necessary to ensure performance.

In a conventional integrated circuit, size of a bus driver increases with the length, load, and speed of a bus. However, the size of a bus driver cannot increase without limitations. First, the silicon area required for a large driver is significant. In addition, multiple levels of pre-drivers are necessary to provide a large bus driver, leading to further requirements in silicon area. Furthermore, a long bus has a long propagation delay.

Bus design has thus an adverse feedback problem—i.e., a bus having a large number of drivers and receivers has a large capacitance, thus requiring larger drivers, which in turn further increases the capacitance, requiring still larger drivers and incurring further pre-driver delays.

One source of capacitance is the parasitic capacitance of a transistor. The drive of a transistor increases linearly with its channel width, which also increases parasitic capacitance.

What is needed is a bus structure that does not require progressively larger drivers for additional load. Furthermore, what is needed is a driver structure that minimizes the driver size as well as the propagation delays.

SUMMARY OF THE INVENTION

The present invention provides a centralized amplifier-accelerator for a tri-state bus structure and an associated method to drive long and heavily loaded busses. This central amplifier-accelerator includes a sense circuit which detects voltage transition at the N-channel threshold for rising transitions or at the P-channel threshold for falling transitions. Once the sense circuit detects a transition, the amplifier-accelerator is triggered to drive the output driver which switches the bus.

The present invention is better understood upon consideration of the detailed description below and the accompanying drawings.

DETAILED DESCRIPTION OF THE PREFERRED EMBODIMENTS

The present invention provides an architecture for a tri-state bus, which provides a centralized bus amplifier-accelerator and which utilizes module drivers as pre-drivers to the centralized amplifier-accelerator. The present invention divides bus driving into the function of sensing a switching event and the function of effectuating the switching event by a centralized large driver.

Figure 1:
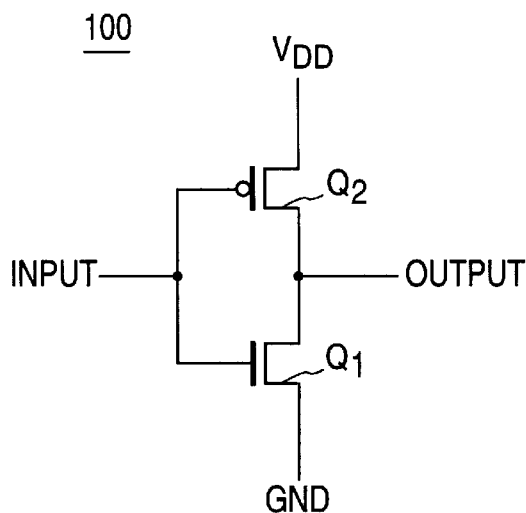
FIG. 1 shows a sense circuit 100.

FIG. 1 shows a sense circuit 100, which is tuned to have a logic transition threshold voltage ("trip point") which is not at one-half of supply voltage, as is the case in a conventional bus driver. Sense circuit 100 includes N-channel transistors Q1 and P-channel transistor Q2 connected in series. To adjust the trip point, transistors Q1 and Q2 are provided different sizes. For example, to provide a trip point close to ground voltage, and hence closer the threshold voltage of transistor Q1 (e.g., 0.6 volts), transistor Q1 is sized to have a larger drive capability than transistor Q2. Similarly to provide a trip point close to supply voltage, and hence closer to the threshold voltage of transistor Q2, transistor Q2 is sized to have a larger drive capability than transistor Q1.

Figure 2:
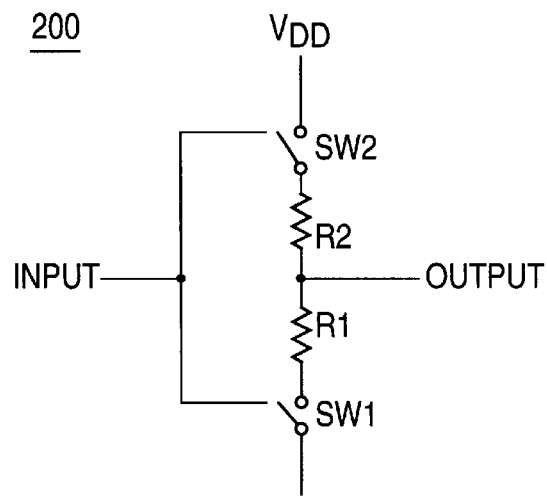
FIG. 2 shows a resistance model 200 of sense circuit 100.

FIG. 2 shows a resistor model 200 of sense circuit 100 of FIG. 1. In FIG. 2, transistor Q1 is represented by switch SW1 and ON-resistance R1, and transistor Q2 is represented by switch SW2 and ON-resistance R2. Thus, transistors Q1 and Q2 can be sized according to their respective ON-resistance. For example, if transistor Q1 can source ten times more current as transistor Q2, i.e., the ON-resistance of transistor Q1 (e.g., 10Ω) is one-tenth of the ON-resistance of transistor Q2 (e.g., 100Ω), for a high-to-low transition, the output voltage quickly reaches the ground reference. By carefully choosing the relative sizes of transistors Q1 and Q2, the trip point can be selected at any value between transistor Q1's $V_t$ up to $V_{DD}$ minus transistor Q2's $V_t$. By selecting a trip point using the relative sizes of transistors Q1 and Q2, switching speed is increased with respect to one transition direction. For example, if transistors Q1 and Q2 are of equal strength, the trip point is at one-half of supply voltage, or 1.5 volts for a 3-volt supply. The output voltage switches when the input signal crosses 1.5 volts. However, if transistor Q1 is made stronger than Q2, the trip point of the driver shifts to a lower level (e.g., 1 volt). Then, the output switches when the input voltage reaches 1 volt, instead of 1.5 volt, thus providing a faster high-to-low output transition. Similarly, setting the trip point closer to the P-channel threshold voltage $V_t$ (e.g., by providing a larger drive in transistor Q2 relative to transistor Q1) achieves a circuit having fast low-to-high transition. In addition, because of the decaying exponential nature of the RC circuit, the speed advantage achieved in trip point adjustment is superlinear, thus further enhancing performance. (For example, in a 3-volt system, where the worst case trip-point can be as high as 2.5 volts, by setting the trip point at 0.8 volts, the switching can be reduced by 80% relative to the worst case.)

Figure 4:
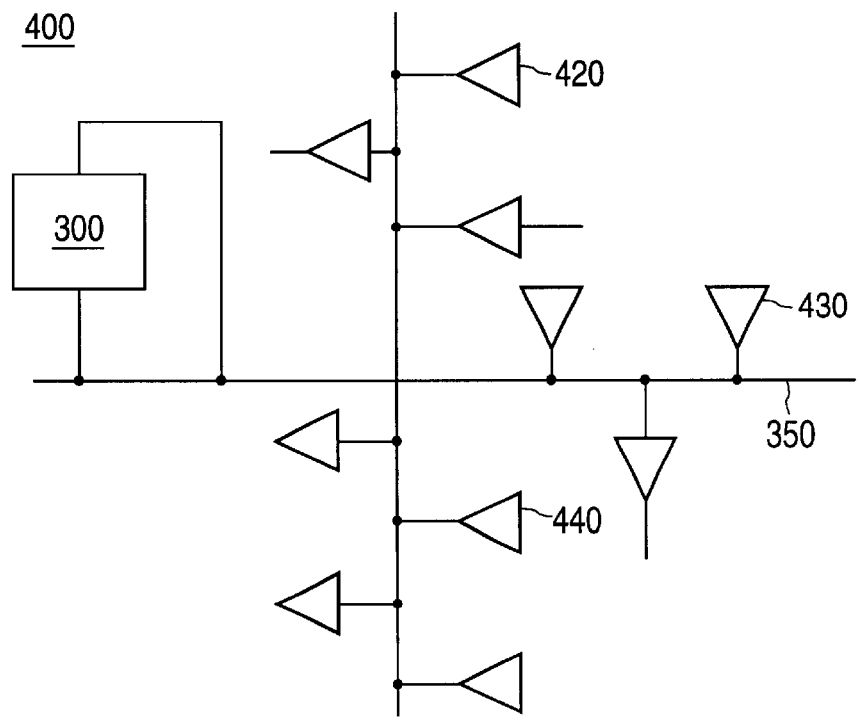
FIG. 4 shows a tri-state bus 350 with various module drivers and centralized amplifier-accelerator 300.

The principles of sense circuit 100 can be used in an amplifier-accelerator of the present invention. FIG. 4 shows a tri-state bus 350 with various module drivers (e.g., module drivers 420, 430 and 440) and a centralized amplifier-accelerator 300, in accordance with the present invention. Under the present invention, module drivers are not intended to drive tri-state bus 350 rapidly to the desired logic state, and hence are sized like pre-drivers in the prior art. However, amplifier-accelerator 300 is intended to be the single driver for tri-state bus 350 with sufficient drive strength to provide the desired performance. Amplifier-accelerator 300 includes sense circuits for sensing a logic value driven by one of the module drivers, and takes over driving tri-state bus 350 when the trip point in a sensing circuit is reached.

Figure 3:
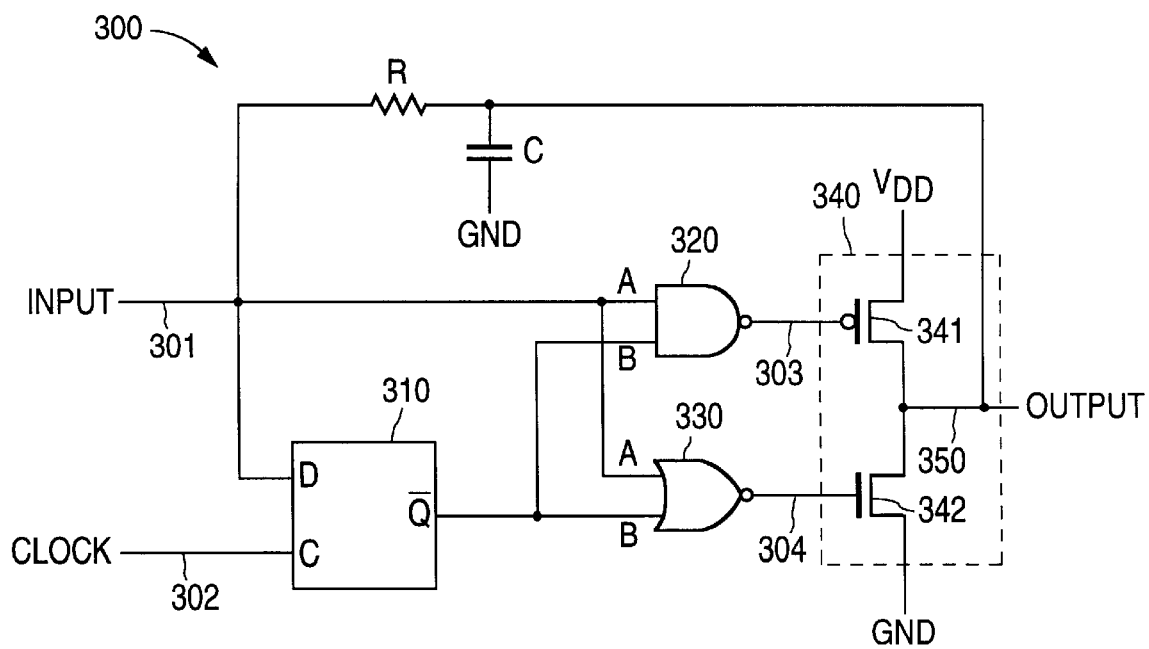
FIG. 3 shows one implementation of a bus amplifier-accelerator 300.

FIG. 3 shows an implementation of tri-state bus amplifier-accelerator 300 of FIG. 4, which is used to drive one bit of a shared bus (terminal 350), in accordance with the present invention. Amplifier-accelerator 300 is preferably placed near the center of a long bus, so as to reduce the longest distance from a pre-driver, as explained below. As shown in FIG. 3, amplifier-accelerator 300 includes a flip-flop 310, NAND gate 320 and NOR gate 330. Flip-flop 310 is provided for latching the logic value of input terminal 301 during the last period of the clock signal at terminal 302. NAND gate 320 and NOR gate 330 each compares the current input logic value at terminal 301 to the input logic value of the last clock period preserved by the inverted output terminal of flip-flop 310. The output values of NAND gate 320 and NOR gate 330 are changed whenever the current logic value matches the logic value at the inverted output terminal of flip-flop 310 (i.e., the input logic value changed since the last clock cycle). In addition, flip-flop 310 ensures that only one of transistors 341 and 342 of output driver 340 is conducting in each clock state. By ensuring only one transistor conducting at a time, the maximum charging current to bring tri-state bus 350 to the desired logic value is achieved, thereby enhancing the switching speed. Because transistors 341 and 342 are not both conducting during logic value transition, as in the prior art, power dissipation due to the transient current from supply $V_{DD}$ to ground is eliminated. For large drivers on wide busses, the power savings can be significant.

NAND gate 320's trip point is set close to the threshold voltages of the N-channel transistors of NAND gate 320 by having a relatively weak P-channel transistor at its input A. NOR gate 330's trip point is set close to the threshold voltages of the P-channel transistors of NOR gate 330 by having a relatively weak N-channel transistor at its input A. Thus, unlike prior art drivers which have trip points of $V_{DD}$/2, amplifier-accelerator 300 detects, through NAND gate 320, a low-to-high input voltage transition at or near the N-channel threshold voltage and detects, through NOR gate 330, a high-to-low input transition at or near the P-channel threshold voltage. This arrangement differs from a conventional device which has CMOS logic thresholds of $V_{DD}$/2. NAND gate 320 and NOR gate 330 control the P-channel and N-channel transistors of output driver 340 to effectuate transition in the output state at terminal 350. Once either one of NAND gate 320's and NOR gate 330's trip point is crossed, amplifier accelerator 300 drives output driver 340 to switch the output logic value at terminal 350 quickly from one logic state to another logic state.

Output driver 340 can be made very large because output driver 340 is the only driver to drive tri-state bus 350 with the desired performance, thereby avoiding the adverse feedback problem discussed above.

The amplifier-accelerator also reduces power by allowing for lower capacitive loads on the bus by virtue of using smaller drivers.

Another advantage of flip-flop 310 is to eliminate feedback problems. Because both NAND gate 320 and NOR gate 330 receive the logic value on tri-state bus 350, feedback problems would occur if a module driver goes high and turns on output driver 340. Tri-state bus 350 would be locked in this state because input A to NAND gate 320 and NOR gate 330 would be reinforced at a logic high state and none of the module drivers has sufficient strength to overcome the drive strength of output driver 340. Another feedback problem is potential oscillation created by the three inverting stages in the circuit. This situation is created when the transistor in output driver 340 does not stay on for the period required to fully charge the output. For example, when both inputs A and B to NAND gate 320 are high, output terminal 303 of NAND gate 320 is low, turning on P-channel transistor 341 of output driver 340. Since the drive strength is not enough to switch the output, the feedback path brings input terminal 301 to a low. NOR gate 330 detects the high-to-low transition and turns on N-channel transistor 342 after a time delay (e.g., of an inverter). The input terminal 301 thus oscillates. Flip-flop 310 breaks the feedback because flip-flop 310 acts as a latching device to hold the prior state. NAND gate 320 and NOR gate 330 have complementary output logic values and never conduct at the same time. When the circuit is in transition, flip-flop 310 changing state always ensures that both transistors 341 and 342 in output driver 340 are turned off at the beginning of any clock period and are turned on for a sufficient period of time to fully switch the output. Thus, flip-flop 310 allows the circuit to have one clean transition for each logic transition at input terminal 301.

Figure 5:
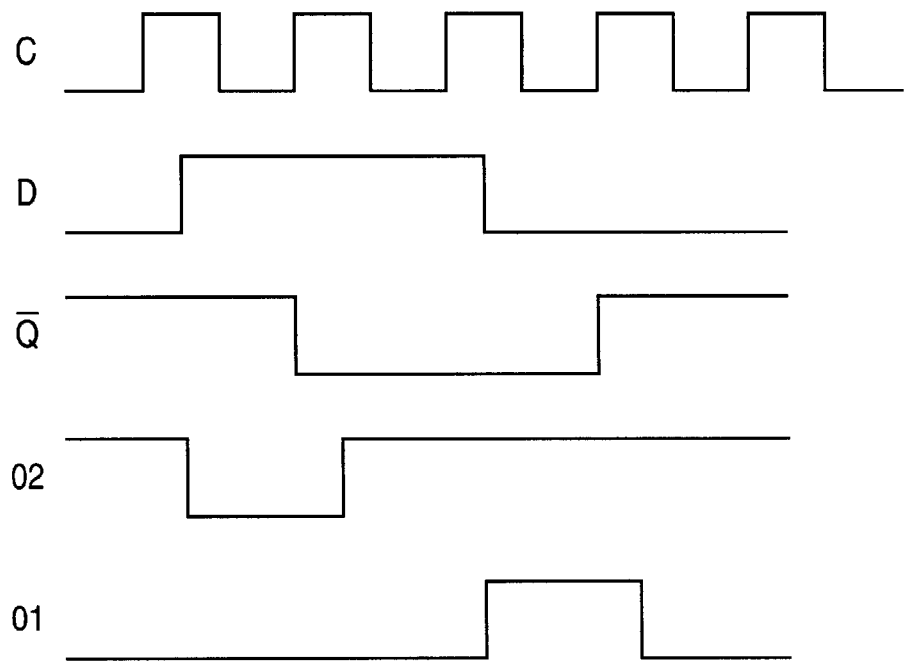
FIG. 5 shows a timing diagram for logic function of bus amplifier-accelerator 300.
Figure 6:
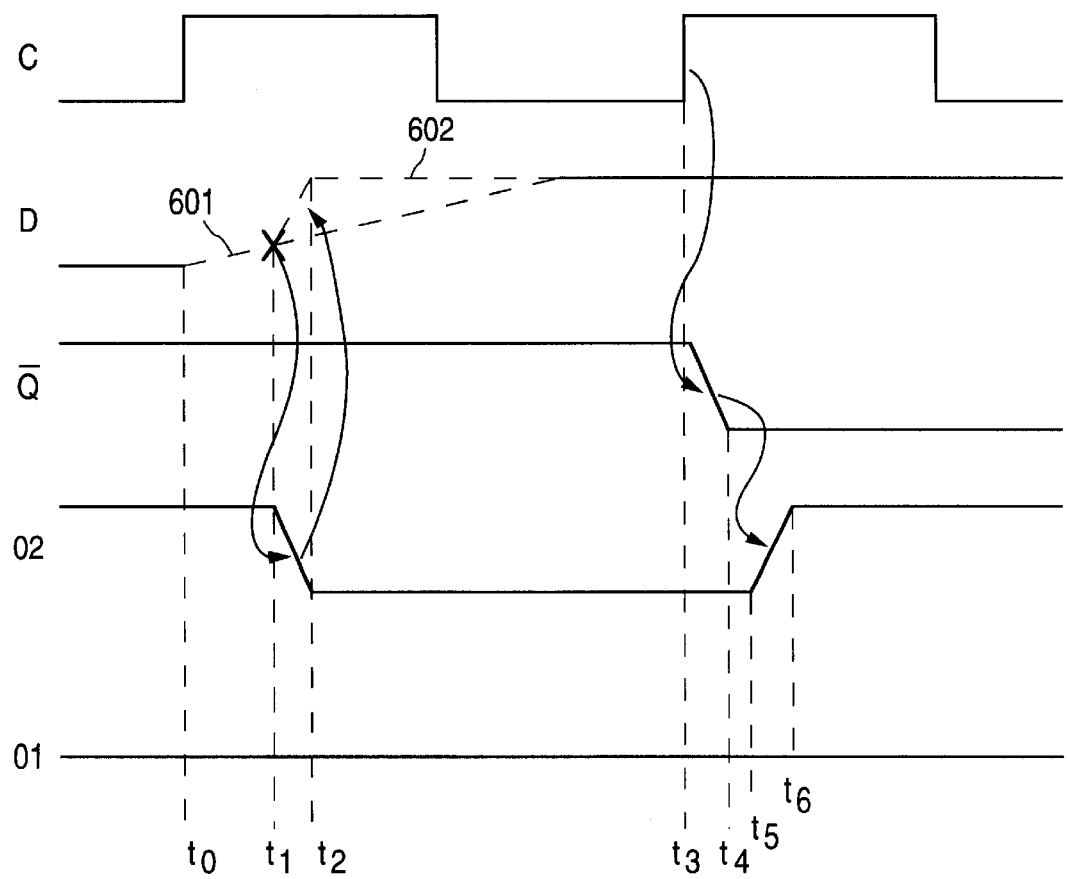
FIG. 6 shows a timing diagram for the analog response of bus amplifier-accelerator 300.

FIG. 5 and FIG. 6 show a timing diagram for a low-to-high transition of tri-state bus 350, and the analog waveforms associate with the transition, respectively. In FIGS. 5 and 6, signal "C" is the clock signal at the clock input terminal 302 of flip-flop 310; signal "D" is the data input/output logic signal of bus amplifier-accelerator 300 (hence logic value on tri-state bus 350); signal "$\overline{Q}$" is the inverted data output signal of flip-flop 310; signal "o2" is the output signal at terminal 303 for NAND gate 320; and signal "o1" is the output signal at terminal 304 for NOR gate 330.

For a low-to-high transition on tri-state bus 350, the state of signal D in the last clock period was "zero" and thus signal $\overline{Q}$ "one". Between time $t_o$ and $t_1$, as signal D rises slowly along waveform segment 601 to the threshold voltage of NAND gate 320, signal o2 drives quickly low, due to the low trip point (e.g., 1 volt) of NAND gate 320 and turning on P-channel transistor 341 in output driver 340. Transistor 341 rapidly drives tri-state bus 350 reaching supply voltage at time $t_2$.

In the next clock cycle (i.e., beginning at time $t_3$, signal $\overline{Q}$ goes to logic low, reaching ground voltage at time $t_4$. Consequently, signal o2 quickly rises at time $t_5$ path and turns off P-channel transistor 341 in output driver 340 at $t_6$. N-channel transistor 342 remains in an off state for this low-to-high transition.

Similarly, for a high-to-low transition on tri-state bus 350, NOR gate 330 turns on and drives signal o1 quickly high, due to the high trip point of NOR gate 330. N-channel transistor 342 turns on which then drives tri-state bus 350 to ground. In the next clock cycle, signal $\overline{Q}$ goes to logic high, reaching supply voltage. Consequently, signal o1 slowly decreases and turns off N-channel transistor 342. P-channel transistor 341 remains in an off state for this high-to-low transition.

The above detailed description is provided to illustrate the specific embodiments of the present invention and is not intended to be limiting. Numerous variations and modifications within the scope of the present invention are possible. The present invention is set forth in the following claims.

I claim:

1. A bus structure, comprising:
   a bus;
   a centralized amplifier-accelerator coupled to said bus; and
   a plurality of module drivers coupled to said bus.
2. The bus structure of claim 1, wherein said plurality of module drivers are pre-drivers to said centralized amplifier-accelerator.

3. The bus structure of claim 1, wherein said amplifier-accelerator is larger than said module drivers.

4. The bus structure of claim 1, wherein said centralized amplifier-accelerator is physically located in a center of a chip.

5. The bus structure of claim 1, wherein said centralized amplifier-accelerator further comprising:

an input;

a tracking mechanism coupled to said input;

a sense circuit coupled to said input and said tracking mechanism; and an output driver having an output, coupled to said sense circuit.

6. The bus structure of claim 5, wherein said sense circuit further comprising first sense cell sensing rising transitions and second sense cell sensing falling transitions.

7. The bus structure of claim 6, wherein said first sense cell is a NAND gate and said second sense cell is a NOR gate.

8. The bus structure of claim 6, wherein said first sense cell further comprising a first transistor and a second transistor coupled in series, said first transistor being an N-channel transistor having a first threshold, said second transistor being a P-channel transistor, and said first transistor having a larger drive capability than said second transistor.

9. The bus structure of claim 8, wherein a threshold of said sense circuit is near said first threshold.

10. The bus structure of claim 6, wherein said second sense cell comprises a first transistor and a second transistor coupled in series, said first transistor being an N-channel transistor, said second transistor being a P-channel transistor having a second threshold, said second transistor having a stronger drive capability than said first transistor.

11. The bus structure of claim 10, wherein a threshold of said sense circuit is near said second threshold.

12. A centralized amplifier-accelerator, comprising:

an input;

a tracking mechanism coupled to said input;

a sense circuit coupled to said input and said tracking mechanism said sense circuit comprising a first sense cell sensing rising transitions and a second sense cell sensing falling transitions; and an output driver having an output, coupled to said sense circuit.

13. The bus structure of claim 12, wherein said first sense cell is a NAND gate and said second sense cell is a NOR gate.

14. The bus structure of claim 12, wherein said first sense cell further comprising a first transistor and a second transistor coupled in series, said first transistor being an N-channel transistor having a first threshold, said second transistor being a P-channel transistor, and said first transistor having larger drive capability than said second transistor.

15. The bus structure of claim 14, wherein a threshold of said sense circuit is near said first threshold.

16. The bus structure of claim 12, wherein said second sense cell comprises a first transistor and a second transistor coupled in series, said first transistor being an N-channel transistor, said second transistor being a P-channel transistor having a second threshold, said second transistor having larger drive capability than said first transistor.

17. The bus structure of claim 16, wherein a threshold of said sense circuit is near said second threshold.

18. A sense circuit comprising:

a first transistor and a second transistor coupled in series between a first reference voltage and a second reference voltage, said first transistor being an N-channel transistor having a first threshold voltage, said second transistor being a P-channel transistor having a second threshold voltage, said first threshold voltage being set at a voltage level between said first reference voltage and a mid-point between said first and second reference voltages, and said second threshold voltage being set at a voltage level between said second threshold voltage and said mid-point.

19. The sense circuit of claim 18, wherein said first transistor has larger drive capability than said second transistor.

20. The sense circuit of claim 19, wherein said sense circuit senses a rising transition.

21. The sense circuit of claim 18, wherein said second transistor has larger drive capability than said first transistor.

22. The sense circuit of claim 21, wherein said sense circuit senses a falling transition.

23. A method of driving a bus, comprising:

providing a centralized amplifier-accelerator coupled to a bus; and providing a plurality of module drivers coupled to said bus.

24. The method of claim 23, wherein providing a centralized amplifier-accelerator further comprising:

tracking the state of said bus;

detecting voltage transition at a threshold; and triggering an output driver at said threshold.

25. The method of claim 24, wherein detecting voltage transition at a threshold further comprising detecting rising transitions.

26. The method of claim 25, further comprising detecting rising transitions at said threshold, said threshold nearing an N-channel threshold.

27. The method of claim 24, wherein detecting voltage transition at a threshold further comprising detecting falling transitions.

28. The method of claim 27, further comprising detecting falling transitions at said threshold, said threshold nearing a P-channel threshold.

* * * * *